United States Patent
Eagen (10) Patent No.: US 11,169,221 B2
(45) Date of Patent: Nov. 9, 2021

(54) TARGET ALIGNMENT AND STRAY FIELD INDICATOR

(71) Applicant: Allegro MicroSystems, LLC, Manchester, NH (US)

(72) Inventor: Jeffrey Eagen, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 53 days.

(21) Appl. No.: 16/801,493

(22) Filed: Feb. 26, 2020

(65) Prior Publication Data

US 2021/0263114 A1 Aug. 26, 2021

(51) Int. Cl.
*G01R 33/00* (2006.01)
*G01R 33/025* (2006.01)
*G01R 33/09* (2006.01)
*G01R 33/07* (2006.01)

(52) U.S. Cl.
CPC ....... *G01R 33/007* (2013.01); *G01R 33/0023* (2013.01); *G01R 33/025* (2013.01); *G01R 33/07* (2013.01); *G01R 33/09* (2013.01)

(58) Field of Classification Search
CPC G01R 33/007; G01R 33/0023; G01R 33/025; G01R 33/09; G01R 33/07
USPC .......................................................... 324/200
See application file for complete search history.

(56) References Cited

U.S. PATENT DOCUMENTS

| | | | |
|---|---|---|---|
| 9,719,806 B2 | 8/2017 | Foletto et al. | |
| 10,670,669 B2 | 6/2020 | Lassalle-Balier et al. | |
| 2003/0020461 A1* | 1/2003 | Nomura | B62D 15/02 |
| | | | 324/200 |
| 2014/0253106 A1* | 9/2014 | Granig | G01D 5/165 |
| | | | 324/207.14 |
| 2015/0022187 A1* | 1/2015 | Taylor | G01R 33/07 |
| | | | 324/207.2 |
| 2016/0123774 A1* | 5/2016 | Foletto | G01D 5/2046 |
| | | | 324/207.21 |
| 2018/0340911 A1 | 11/2018 | Romero | |
| 2019/0162784 A1 | 5/2019 | Lassalle-Balier et al. | |
| 2019/0234763 A1 | 8/2019 | Foletto et al. | |
| 2019/0235032 A1 | 8/2019 | Lassalle-Balier et al. | |
| 2020/0041310 A1 | 2/2020 | Lassalle-Balier et al. | |
| 2020/0041583 A1 | 2/2020 | Cadugan et al. | |
| 2020/0116800 A1 | 4/2020 | Lassalle-Balier et al. | |

OTHER PUBLICATIONS

U.S. Appl. No. 16/244,452, filed Jan. 10, 2019, Lassalle-Balier et al.
U.S. Appl. No. 16/507,544, filed Jul. 10, 2019, David et al.
U.S. Appl. No. 16/507,552, filed Jul. 10, 2019, Lassalle-Balier et al.
U.S. Appl. No. 16/507,560, filed Jul. 10, 2019, Lassalle-Balier et al.
U.S. Appl. No. 16/800,229, filed Feb. 25, 2020, Lassalle-Balier et al.

* cited by examiner

*Primary Examiner* — Christopher P McAndrew
(74) *Attorney, Agent, or Firm* — Daly, Crowley, Mofford & Durkee, LLP (57) ABSTRACT

A magnetic field sensor is provided, including a substrate, a first bridge circuit formed on the substrate, the first bridge circuit being arranged to generate a first signal indicative of a motion of a target, and a second bridge circuit formed on the substrate, the second bridge circuit being arranged to generate a second signal indicative of whether the magnetic field sensor is aligned with the target.

27 Claims, 7 Drawing Sheets

<DETECTS SPEED OF ROTATION>   <DETECTS OFFSET RELATIVE TO AXIS G-G>

TARGET ALIGNMENT AND STRAY FIELD INDICATOR

BACKGROUND

Various types of magnetic field sensing elements are known, including Hall Effect elements and magnetoresistance (MR) elements. Magnetic field sensors generally include a magnetic field sensing element and other electronic components. Magnetic field sensors provide an electrical signal representative of a sensed magnetic field. In some sensors that have a back-bias magnet, the sensed magnetic field is a magnetic field generated by the magnet, in which case, in the presence of a moving ferromagnetic object, the magnetic field generated by the magnet and sensed by the magnetic field sensor varies in accordance with a shape or profile of the moving ferromagnetic object. In contrast, magnetic field sensors that sense a moving magnet directly sense variations of magnetic field magnitude and direction that result from movement of the magnet.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a magnetic field sensor is provided, including: a substrate, a first bridge circuit formed on the substrate, the first bridge circuit being arranged to generate a first signal indicative of a motion of a target, and a second bridge circuit formed on the substrate, the second bridge circuit being arranged to generate a second signal indicative of whether the magnetic field sensor is aligned with the target.

According to aspects of the disclosure, a magnetic field sensor includes a substrate having a first axis defining a first region and a second region, the first region and the second region being on opposite sides of the first axis, a first plurality of magnetic field sensing elements formed on the substrate, the first plurality of magnetic field sensing elements including a first magnetic field sensing element that is coupled in series with a second magnetic field sensing element, the first magnetic field sensing element being formed in the first region of the substrate and the second magnetic field sensing element being formed in the second region of the substrate, and a second plurality of magnetic field sensing elements formed on the substrate, the second plurality of magnetic field sensing elements including a third magnetic field sensing element that is coupled in series with fourth magnetic field sensing element, the third magnetic field sensing element formed in the first region of the substrate and a fourth magnetic field sensing element formed in the first region of the substrate.

According to aspects of the disclosure, a magnetic field sensor is provided including a substrate having a first axis and a second axis that intersects the first axis, a first plurality of magnetic field sensing elements formed on the substrate, the first plurality of magnetic field sensing elements including a first magnetic field sensing element that is coupled in series with a second magnetic field sensing element, the first magnetic field sensing element and the second magnetic field sensing element being formed on opposite sides of the first axis and the second axis, a second plurality of magnetic field sensing elements formed on the substrate, the second plurality of magnetic field sensing elements including a third magnetic field sensing element that is coupled in series with a fourth magnetic field sensing element, the third magnetic field sensing element and the fourth magnetic field sensing element being formed on opposite sides of the first axis and the second axis, the second plurality of magnetic field sensing elements being electrically coupled to the first plurality of magnetic field sensing elements to form a first bridge circuit.

According to aspects of the disclosure, a magnetic field sensor is provided, including a substrate, a first bridge circuit formed on the substrate, the first bridge circuit being arranged to generate a first signal indicative of a motion of a target, and a means for generating a second signal indicative of whether the magnetic field sensor is aligned with the target.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1A:
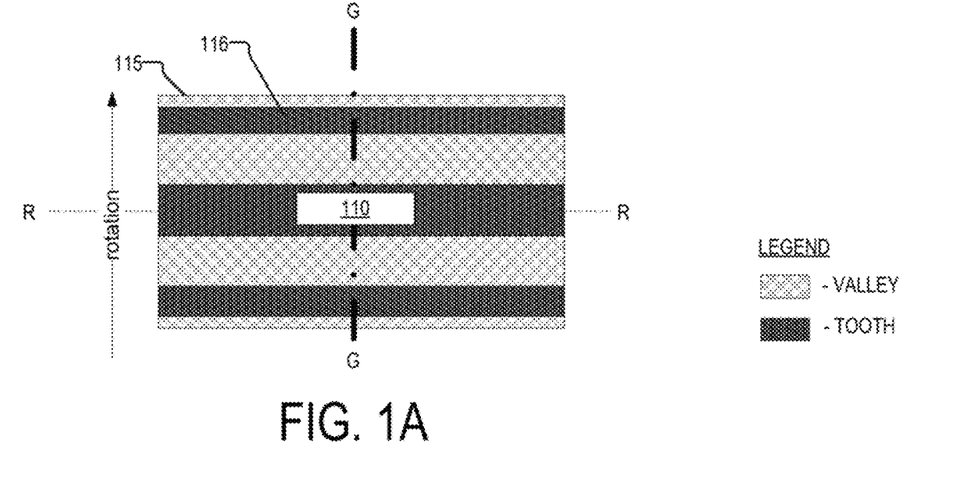
FIG. 1A is a top-down view of an example of a system including a rotating target and a magnetic field sensor, according to aspects of the disclosure.
Figure 1B:
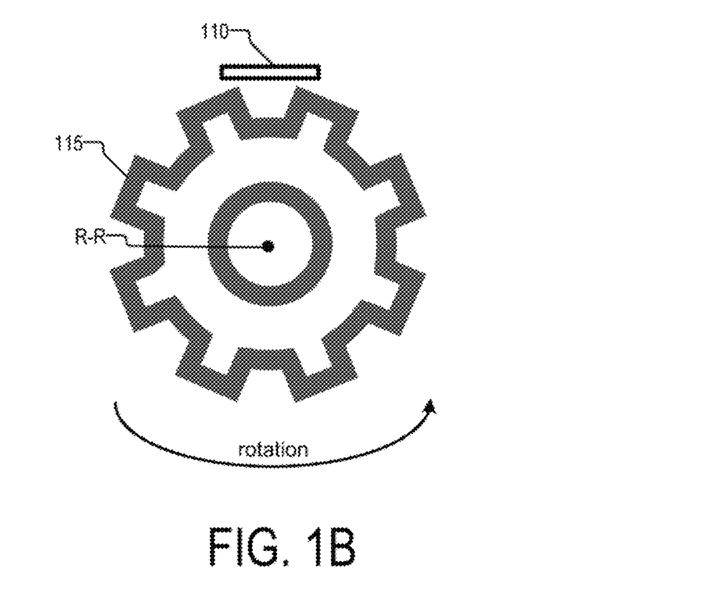
FIG. 1B is a side view of the system of FIG. 1A, according to aspects of the disclosure.

FIGS. 1A-B show an example of a system 100 that includes a magnetic field sensor 110 and a rotating target 115. The rotating target 115 may include a gear or ring magnet that is made of a ferrous or ferromagnetic material, and it may rotate about a rotational axis R-R. The sensor 110 may be disposed adjacent to an outer surface 116 of the target 115, such that a plane of the sensor 110 is substantially parallel with the rotational axis R-R. The outer surface 116 of the target may include a plurality of teeth and valleys. In operation, the sensor 110 may detect changes in a magnetic field that is incident on the sensor 110 and generate a first signal indicating a speed of rotation of the target 115. (E.g., see signal $S_{rotation}$ which is discussed further below with respect to FIGS. 2C and 3C, etc.) Furthermore, the sensor 110 may generate a second signal indicating whether the sensor 110 is aligned with the target 115. (E.g., see signal $S_{alignment}$ which is discussed further below with respect to FIGS. 2C and 3C, etc.)

Figure 2A:
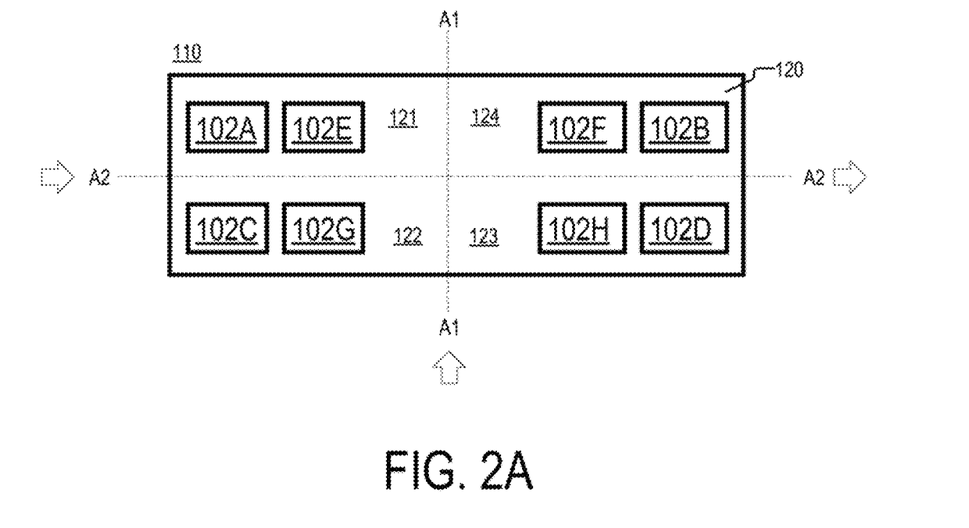
FIG. 2A is a schematic diagram of an example of a magnetic field sensor, according to aspects of the disclosure.
Figure 2B:
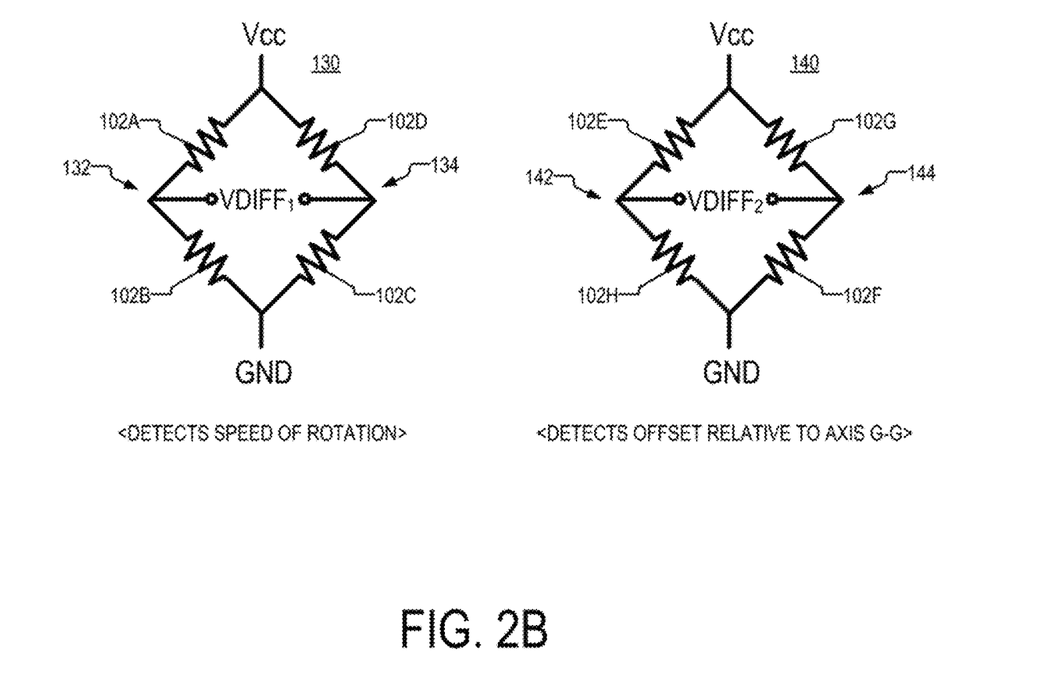
FIG. 2B is a circuit diagram illustrating magnetoresistive bridge circuits that are part of the magnetic field sensor of FIG. 2A, according to aspects of the disclosure.
Figure 2C:
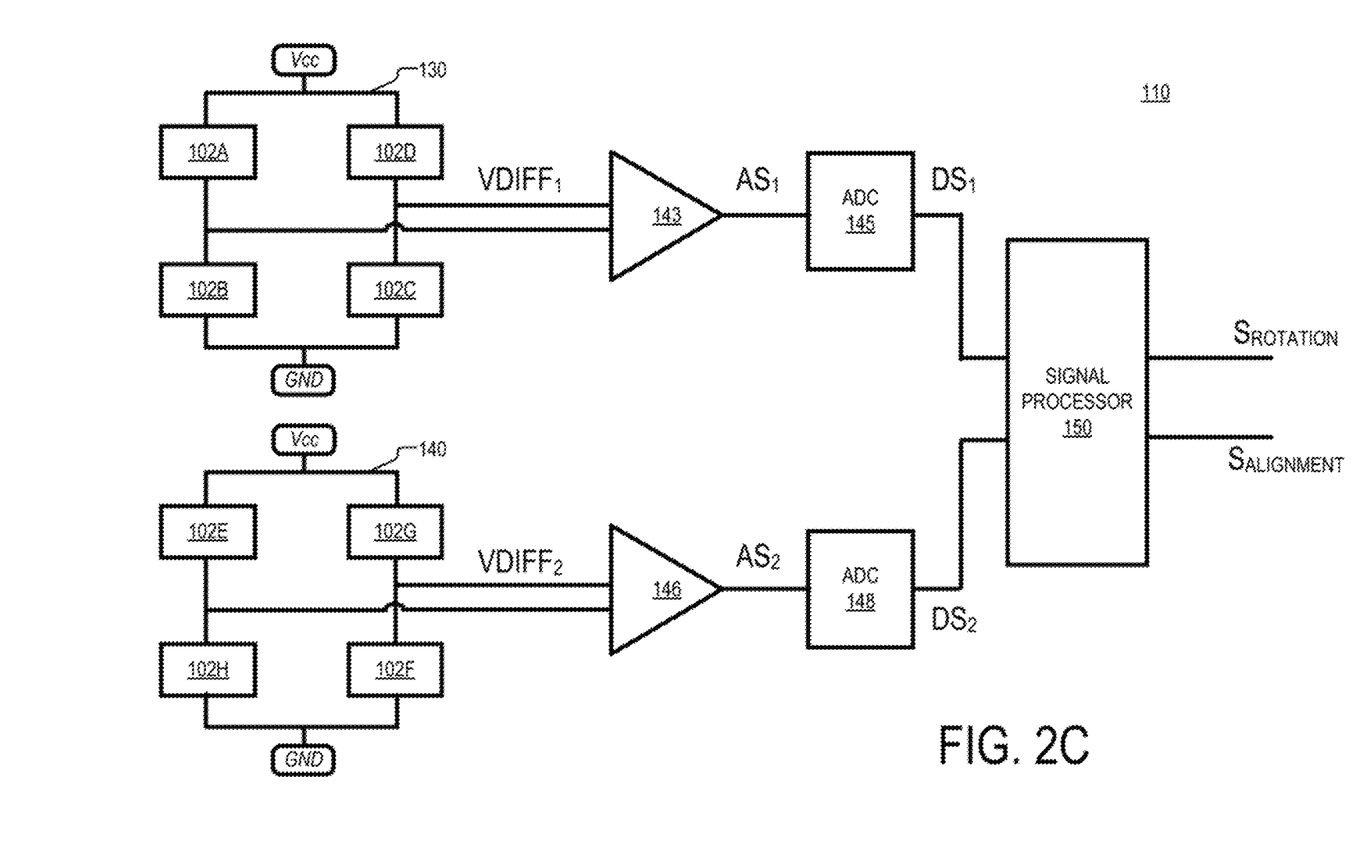
FIG. 2C is a circuit diagram of the magnetic field sensor of FIG. 2A, according to aspects of the disclosure.

FIGS. 2A-C show an example of one implementation of the sensor 110. As illustrated in FIG. 2C, the sensor 110 may include a first bridge circuit 130 (e.g., a full bridge circuit) and a second bridge circuit 140 (e.g., a full bridge circuit). The first bridge circuit 130 may be configured to generate a differential signal $VDIFF_1$. The first differential signal $VDIFF_1$ may be a voltage signal indicating the speed of rotation of the target 115.

In particular, the first differential signal $VDIFF_1$ can be expressed as follows:

$$V_{DIFF1} = \frac{102B}{102A + 102B} - \frac{102C}{102C + 102D}$$

where 102A, 102B, 102C, and 102D represent the voltage across the respective sensing element.

As a target 115 rotates with respect to the sensor 110, the magnetic fields incident on elements 102A and 102C are substantially equal to each other and the magnetic fields incident on elements 102B and 102D are substantially equal to each other. This occurs because elements 102A and 102C are vertically aligned with each other (see FIG. 2A) and thus are affected in the same manner by a passing target feature (i.e., tooth or valley) and likewise elements 102B and 102D are vertically aligned with each other (see FIG. 2A) and thus are affected in the same manner by a passing target feature. Thus, the first differential signal $VDIFF_1$ can be simplified to:

$$V_{DIFF1} = \frac{102B - 102A}{102A + 102B}$$

and the resulting signal VDIFF1 is a sinewave.

The first differential signal $VDIFF_1$ may be provided to an amplifier 143. The first differential signal $VDIFF_1$ may be amplified by the amplifier 143 to produce a first amplified signal $AS_1$, which is subsequently provided to an analog-to-digital converter (ADC) 145. The ADC 145 may digitize the first amplified signal $AS_1$ to produce a first digital signal $DS_1$, which is supplied to the signal processor 150.

The second bridge circuit 140 may be configured to generate a second differential signal $VDIFF_2$. The second differential signal $VDIFF_2$ may be a voltage signal indicating whether the sensor 110 is aligned with the target 115, and it may be provided to an amplifier 146. Alignment of the sensor 110 with the target 115 is defined in connection with FIGS. 4A and 4B. Suffice it to say here that when the sensor 110 is aligned with the target 115, the second differential signal $VDIFF_2$ is zero volts and when the sensor is misaligned with the target, the second differential signal is a non-zero DC level. In particular, the second differential signal $VDIFF_2$ can be expressed as follows:

$$V_{DIFF2} = \frac{102H}{102E + 102H} - \frac{102G}{102F + 102G}$$

where 102E, 102F, 102G, and 102H represent the voltage across the respective sensing element.

As a target 115 rotates with respect to an aligned sensor 110, the magnetic fields incident on elements 102E and 102G are substantially equal to each other and the magnetic fields incident on elements 102F and 102H are substantially equal to each other. This occurs because elements 102E and 102G are vertically aligned with each other (see FIG. 2A) and thus are affected in the same manner by a passing target feature (i.e., tooth or valley) and likewise elements 102F and 102H are vertically aligned with each other (see FIG. 2A) and thus are affected in the same manner by a passing target feature. Thus, the second differential signal $VDIFF_2$ can be simplified to:

$$V_{DIFF2} = \frac{102G}{102G + 102H} - \frac{102G}{102G + 102H}$$

resulting in the second differential signal $VDIFF_2$ being a zero-volt signal. Thus, the second bridge 140 does not respond to rotation of the target 115 (i.e., generates a zero volt output) when the sensor is aligned with the target. Significantly however, when the sensor 110 is not aligned with the target 115, elements 102E and 102G will sense different magnetic field strengths than each other and sensors 102F and 102H will also sense different magnetic field strengths than each other, thereby resulting in a non-zero second differential signal $VDIFF_2$.

The second differential signal $VDIFF_2$ may be amplified by the amplifier 146 to produce a second amplified signal $AS_2$, which is subsequently provided to an analog-to-digital converter (ADC) 148. The ADC 148 may digitize the second amplified signal $AS_2$ to produce a second digital signal $DS_2$, which is supplied to the signal processor 150.

The signal processor 150 may be configured to output a rotation signal $S_{rotation}$ and an alignment signal $S_{alignment}$. The rotation signal $S_{rotation}$ may be generated based on the first digital signal DS1 (which is generated by using the first bridge circuit 130). In some implementations, the rotation signal $S_{rotation}$ may be generated as discussed in U.S. patent application Ser. No. 16/527,313, titled MAGNETIC FIELD SENSOR, which is hereby incorporated herein by reference in its entirety. The alignment signal $S_{alignment}$ may be generated at least in part based on the second digital signal $DS_2$ (which is generated by using the second bridge circuit 140). In some implementations, the alignment signal $S_{alignment}$ may be a replica of the second digital signal $DS_2$. Additionally or alternatively, in some implementations, the alignment signal $S_{alignment}$ may be generated by adjusting the second digital signal $DS_2$ based on temperature, humidity, and/or another characteristic of the ambient environment of the sensor 110. Stated succinctly, the present disclosure is not limited to any specific method for generating the alignment signal $S_{alignment}$ based on the digital signal $DS_2$.

As illustrated in FIG. 2B, the first bridge circuit 130 may include a first branch 132 that is coupled in parallel with a second branch 134. The first branch 132 may include an element 102A that is coupled in series with an element 102B. The second branch 134 may include an element 102C that is coupled in series with an element 102D. The element 102A may be coupled to ground via the element 102B, and the element 102B may be coupled to a voltage source Vcc via the element 102A. The element 102D may be coupled to ground via the element 102C, and the element 102C may be coupled to a voltage source Vcc via the element 102D. In some implementations, any of the elements 102A-D may include a Hall effect element, a giant magnetoresistance (GMR) element, a tunnel magnetoresistance (TMR) element, an anisotropic magnetoresistance (AMR) element, a magnetic tunnel junction (MTJ) element, and/or any other suitable type of magnetoresistive element.

The second bridge circuit 140 may include a first branch 142 that is coupled in parallel with a second branch 144. The first branch 142 may include an element 102E that is coupled in series with an element 102H. The second branch 144 may include an element 102G that is coupled in series to an element 102F. The element 102E may be coupled to ground via the element 102H, and the element 102H may be coupled to the voltage source Vcc via the element 102E. The element 102G may be coupled to ground via the element 102F, and the element 102F may be coupled to a voltage source Vcc via the element 102G. In some implementations, any of the elements 102E-H may include a Hall effect element, a giant magnetoresistance (GMR) element, a tunnel magnetoresistance (TMR) element, an anisotropic magnetoresistance (AMR) element, a magnetic tunnel junction (MTJ) element, and/or any other suitable type of magentoresistive element.

As illustrated in FIG. 2A, the sensor 110 may be formed on a substrate 120. The substrate 120 may have a first axis A1-A1 and a second axis A2-A2 that intersects the first axis A1-A1. Optionally, the first axis A1-A1 and the second axis A2-A2 may be orthogonal to one another. Additionally or alternatively, in some implementations, the axes A1-A1 and A2-A2 may define a plurality of regions of the substrate 120, which are herein referred to as a region 121, a region 122, a region 123, and a region 124.

In some implementations, the elements of the first branch 132 may be formed on opposite sides of the first axis A1-A1. Additionally or alternatively, in some implementations, the elements of the first branch 132 may be formed on the same side of the second axis A2-A2. Additionally or alternatively, in some implementations, the elements of the second branch 134 may be formed on opposite sides of the first axis A1-A1. Additionally or alternatively, in some implementations, the elements of the second branch 134 may be formed on the same side of the second axis A2-A2. Additionally or alternatively, in some implementations, the elements of the first branch 142 may be formed on opposite sides of both the first axis A1-A1 and the second axis A2-A2. Additionally or alternatively, in some implementations, the elements of the second branch 144 may be formed on opposite sides of both the first axis A1-A1 and the second axis A2-A2. More particularly, according to the example of FIGS. 2A-C, the elements 102a and 102e may be formed in the region 121 of the substrate 120; the elements 102C and 102G may be formed in the region 122 of the substrate 120; the elements 102H and 102D may be formed in the region 123 of the substrate 120; and the elements 102F and 102B may be formed in the region 124 of the substrate. However, it will be understood that the present disclosure is not limited to the example of FIGS. 2A-C.

Figure 3A:
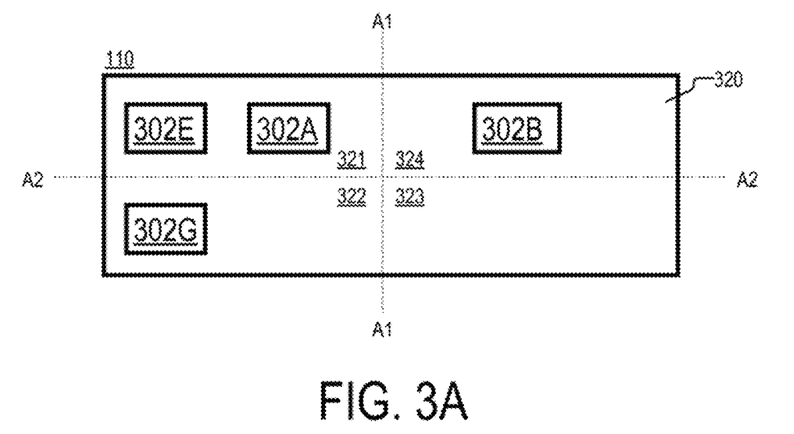
FIG. 3A is a schematic diagram of an example of a magnetic field sensor, according to aspects of the disclosure.
Figure 3B:
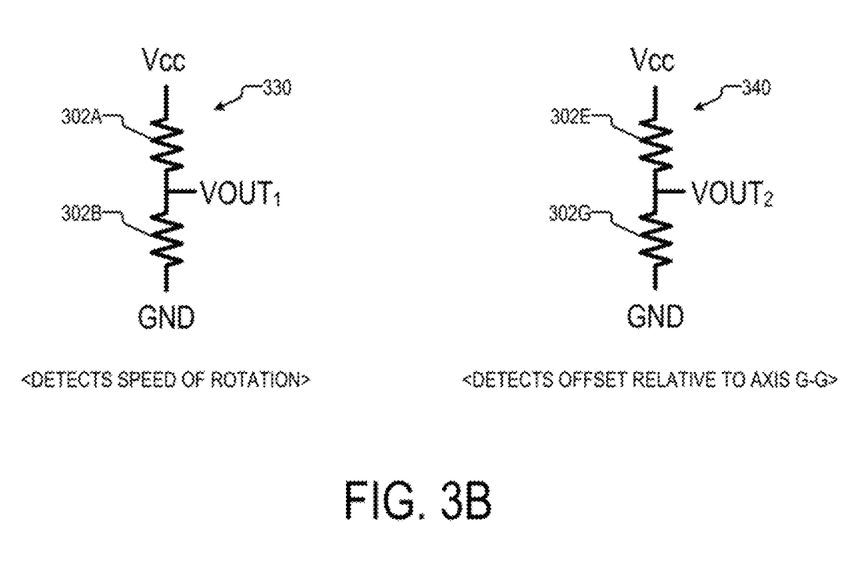
FIG. 3B is a circuit diagram illustrating magnetoresistive bridge circuits that are part of the magnetic field sensor of FIG. 3A, according to aspects of the disclosure.
Figure 3C:
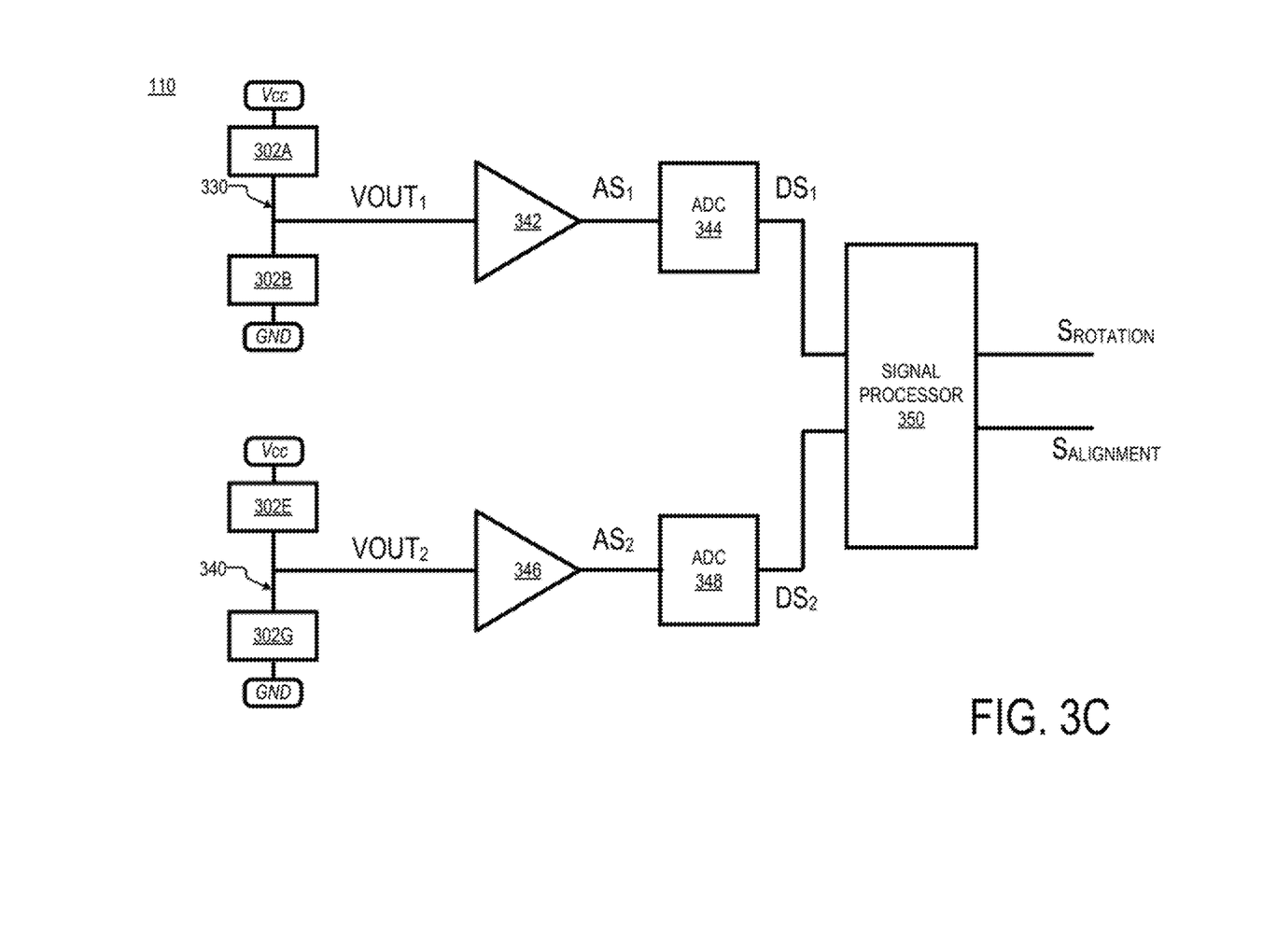
FIG. 3C is a circuit diagram of the magnetic field sensor of FIG. 3A, according to aspects of the disclosure.

FIGS. 3A-C show an example of another implementation of the sensor 110. As illustrated in FIG. 3C, the sensor 110 may include a first bridge circuit 330 (e.g., a half bridge circuit) and a second bridge circuit 340 (e.g. a half bridge circuit). The first bridge circuit 330 may be configured to generate a first signal $VOUT_1$. The first signal $VOUT_1$ may indicate a speed of rotation of the target 115, and it may be provided to an amplifier 342. The first signal $VOUT_1$ may be amplified by an amplifier 342 to produce a first amplified signal $AS_1$, which is subsequently provided to an analog-to-digital converter (ADC) 344. The ADC 344 may digitize the first amplified signal $AS_1$ to produce a first digital signal $DS_1$, which is supplied to the digital signal processor 350.

The second bridge circuit 340 may be configured to generate a second signal $VOUT_2$. The second signal $VOUT_2$ may indicate whether the sensor 110 is aligned with the target 115, and it may be provided to an amplifier 346. The second signal $VOUT_2$ may be amplified by an amplifier 346 to produce a second amplified signal $AS_2$, which is subsequently provided to an analog-to-digital converter (ADC) 348. The ADC 348 may digitize the second amplified signal $AS_2$ to produce a second digital signal $DS_2$, which is supplied to the digital signal processor 350.

The signal processor 350 may be configured to output a rotation signal $S_{rotation}$ and an alignment signal $S_{alignment}$. The rotation signal $S_{rotation}$ may be generated based on the first digital signal $DS_1$ (which is generated by using the first bridge circuit 330). The alignment signal $S_{alignment}$ may be generated at least in part based on the second digital signal $DS_2$ (which is generated by using the second bridge circuit 340). In some implementations, the alignment signal $S_{alignment}$ may be a replica of the second digital signal $DS_2$. Additionally or alternatively, in some implementations, the alignment signal $S_{alignment}$ may be generated by adjusting the second digital signal $DS_2$ based on temperature, humidity, and/or another characteristic of the ambient environment of the sensor 110. Stated succinctly, the present disclosure is not limited to any specific method for generating the alignment signal $S_{alignment}$ based on the digital signal $DS_2$.

As illustrated in FIG. 3B, the first bridge circuit 330 may include elements 302A and 302B that are coupled in series to one another. The element 302A may be coupled to ground via the element 302B, and the element 302B may be coupled to a voltage source Vcc via the element 302A. The second bridge circuit 340 may include elements 302A and 302G that are coupled in series to one another. The element 302E may be coupled to ground via the element 302G, and the element 302G may be coupled to the voltage source Vcc via the element 302E. In some implementations, any of the elements 302A, 302B, 302E, and 302G may include a Hall effect element, a giant magnetoresistance (GMR) element, a tunnel magnetoresistance (TMR) element, an anisotropic magnetoresistance (AMR) element, a magnetic tunnel junction (MTJ) element, and/or any other suitable type of magnetoresistive element.

As illustrated in FIG. 3A, the sensor 110 may be formed on a substrate 320. The substrate 320 may have a first axis A1-A1 and a second axis A2-A2 that intersects the first axis A1-A1. Optionally, the first axis A1-A1 and the second axis A2-A2 may be orthogonal to one another. Additionally or alternatively, in some implementations, the axes A1-A1 and A2-A2 may define a plurality of regions of the substrate 320, which are herein referred to as a region 321, a region 322, a region 323, and a region 323.

In some implementations, the elements of the first bridge circuit 330 may be formed on opposite sides of the first axis A1-A1. Additionally or alternatively, in some implementations, the elements of the first bridge circuit 330 may be formed on the same side of the second axis A2-A2. Additionally or alternatively, in some implementations, the elements of the second bridge circuit 340 may be formed on the same side of the first axis A1-A1. Additionally or alternatively, in some implementations, the elements of the second bridge circuit 340 may be formed on opposite sides of the second axis A2-A2. According to the example of FIGS. 3A-C, the elements 302E and 302A may be formed in the region 321 of the substrate 320; the element 302G may be formed in the region 322 of the substrate 320; and the element 302B may be formed in the region 324. However, it will be understood that FIGS. 3A-C are provided as an example only, and the present disclosure is not limited thereto.

Figure 4A:
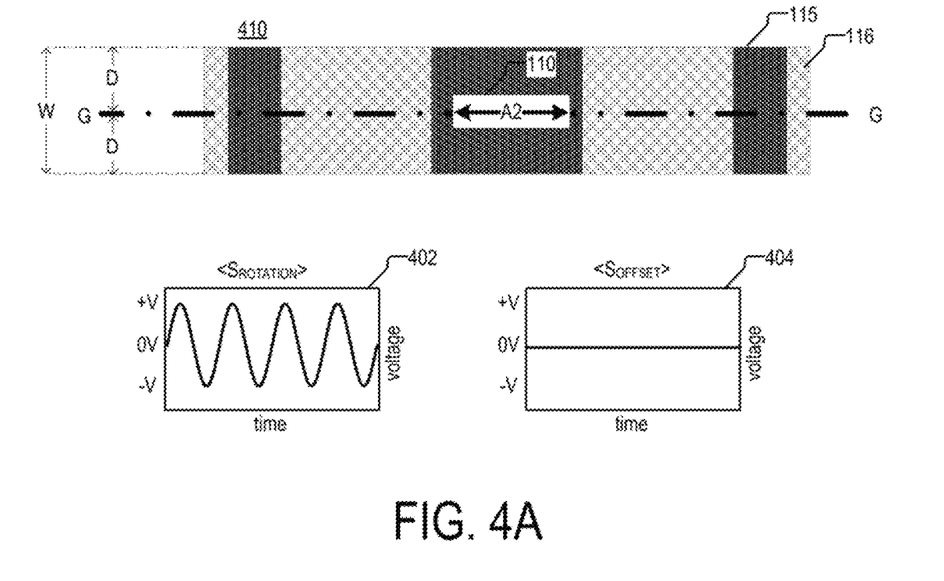
FIG. 4A is a diagram illustrating the operation of any of the magnetic field sensors of FIGS. 2A and 3A, according to aspects of the disclosure.
Figure 4B:
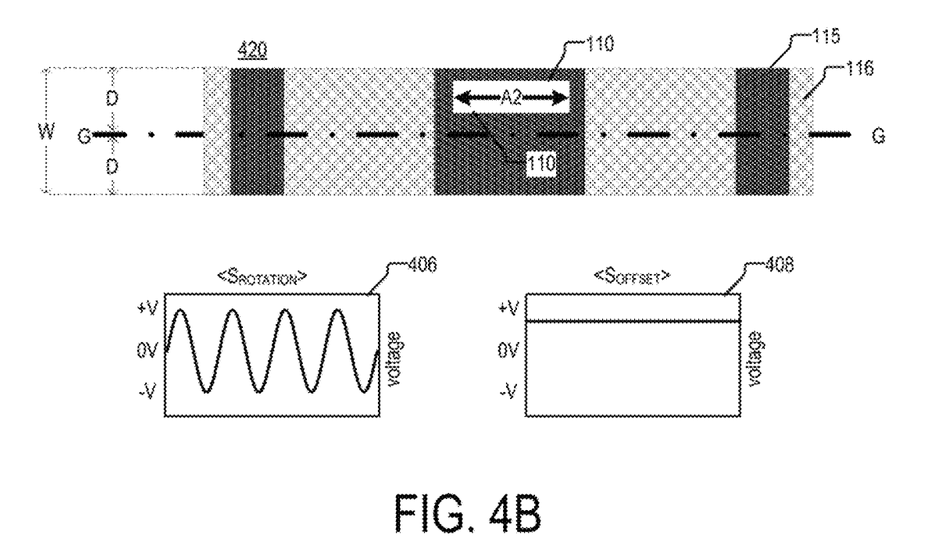
FIG. 4B is a diagram illustrating the operation of any of the magnetic field sensors of FIGS. 2A and 3A, according to aspects of the disclosure.

FIGS. 4A and 4B illustrate aspects of the operation of the sensor 110. FIG. 4A shows the sensor 110 in a first state 410, in which the sensor 110 is aligned with a central axis G-G of the of the target 115. The central axis G-G extends along the circumference of the target 115, and it is spaced apart by the same distance D from each of the sides of the target 115. The central axis G-G, in other words, runs along the middle of the outer surface of the target 115. As illustrated, in FIG. 4A, when the sensor 110 is aligned with the target 115, the second axis A2-A2 of the sensor 110 is situated directly over the central axis G-G, such that the second axis A2-A2 is also spaced by the same distance D from each of the sides of the target 115. Also shown in FIG. 4A is a plot 402 of the signal $S_{rotation}$ that is output by the sensor 110 when the sensor 110 is aligned with the target 115 and a plot 404 of the signal $S_{alignment}$. As illustrated, the signal $S_{alignment}$ may be 0V when the sensor 110 is aligned with the target 115.

FIG. 4B shows the sensor 110 in a state 420 in which the sensor 110 is misaligned with the target 115. As illustrated, in some implementations, the sensor 110 may be misaligned with the target 115 when the second axis A2-A2 is offset from the central axis G-G (of the target 115) along a width W of the target 115. According to the present example the width W of the target is parallel with the axis of rotation R-R (shown in FIGS. 1A-B). Additionally or alternatively, in some implementations, the sensor 110 may be misaligned with the target 115 when the plane of the sensor 110 (e.g., the substrate 120/320) is at an angle (e.g., an angle greater than a threshold angle) relative to the outer surface of the target 115. Also shown in FIG. 4B is a plot 406 of the signal $S_{rotation}$ that is output by the sensor 110 when the sensor 110 is aligned with the target 115 and a plot 408 of the signal $S_{alignment}$. As illustrated, the signal $S_{alignment}$ may be greater (or less) than 0V when the sensor 110 is misaligned with the target 115. More generally, any non-zero value of the signal $S_{alignment}$ can indicate a misalignment of the sensor 110 with respect to the target 115.

Furthermore, when the sensor 110 is aligned with the target 115, and a stray magnetic field (e.g., as illustrated by arrows in FIG. 2A) is incident on the sensor 110, the signal $S_{alignment}$ may also be different than 0V (e.g., greater than or less than 0V). In some applications, the alignment between the sensor 110 and the target 115 may be measured (by using the signal $S_{alignment}$) when the sensor 110 and/or the target 115 are being installed in a larger system to confirm that the installation is performed correctly. After it is determined that the installation is performed correctly, the sensor 110 and the target 115 may not be expected to become misaligned. Accordingly, after the initial verification that the installation is performed correctly, the signal $S_{alignment}$ may be used to detect the presence of stray magnetic fields that could impact the accuracy of the sensor 110 and/or the first bridge circuit 140. The initial verification that the installation is performed correctly may be carried in a controlled environment where no stray magnetic fields are present.

Figure 5:
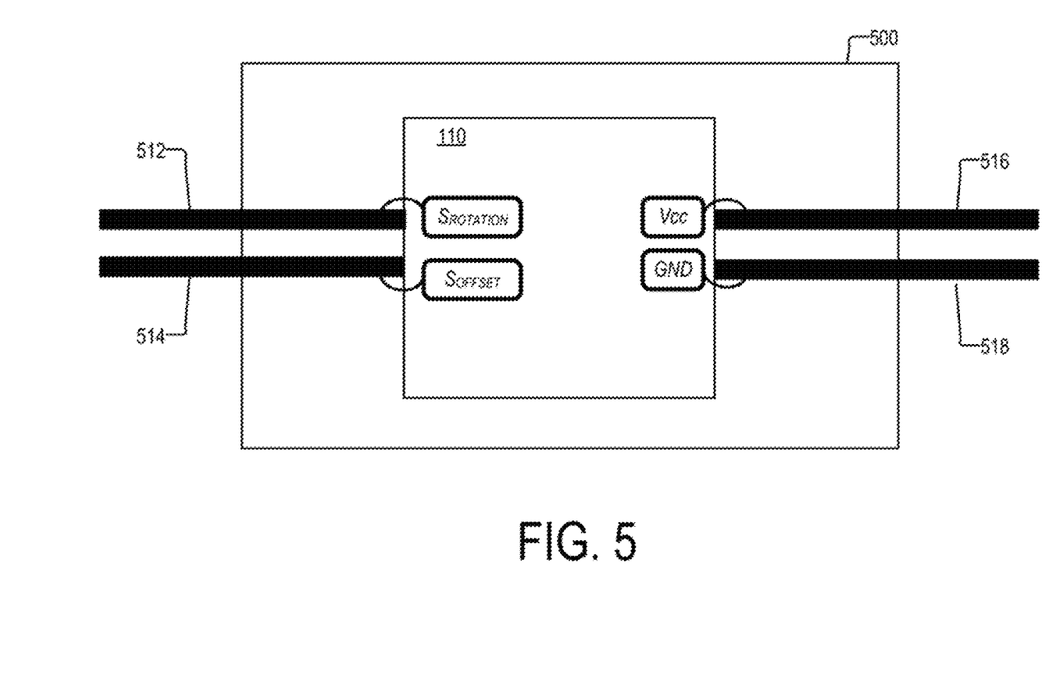
FIG. 5 is a diagram of an example of an integrated circuit package, according to aspects of the disclosure.

FIG. 5 shows an example of an integrated circuit package 500 that contains the sensor 110, according to aspects of the disclosure. As illustrated, terminals 512-518 may be provided on the sides of the package 500, as shown. Terminal 512 of the package 500 may be configured to output the signal $S_{rotation}$ that is generated by the signal processor 150/350. Terminal 514 of the package 500 may be configured to output the signal $S_{alignment}$ that is generated by the signal processor 150/350. Terminal 516 may be configured to connect the bridge circuits 130/140 or 330/340 to an external voltage source Vcc. Terminal 518 may be configured to connect the bridge circuits 130/140 or 330/340 to ground.

FIGS. 1A-5 are provided as an example only. As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims. By way of a non-limiting example, it will be appreciated that while the sensor 110 embodiments shown in FIGS. 2C and 3C contain two bridge circuits (one for sensing target movement such as rotation and one for sensing sensor misalignment), in embodiments a single bridge circuit can be configurable to sense target movement in a first configuration and to sense sensor misalignment in a second configuration. In such an embodiment, multiplexers can be used to select the particular bridge configuration. (final)

The invention claimed is:

1. A magnetic field sensor, comprising:
   a substrate;
   a first bridge circuit formed on the substrate, the first bridge circuit being arranged to generate a first signal indicative of a motion of a target; and
   a second bridge circuit formed on the substrate, the second bridge circuit being arranged to generate a second signal indicative of whether the magnetic field sensor is aligned with a central axis of the target, the central axis extending along a circumference of the target, and the second bridge circuit being configured such that: (i) the second signal is set to a first level when the magnetic field sensor is aligned with the central axis and (ii) and the second signal is set to a second DC level when the magnetic field sensor is offset from the central axis.

2. The magnetic field sensor of claim 1, wherein the second signal is further indicative of a presence of a stray magnetic field.

3. The magnetic field sensor of claim 1, wherein the first bridge circuit includes a full bridge circuit, the second bridge circuit includes a full bridge circuit, and the second signal is further indicative of a presence of a stray magnetic field.

4. The magnetic field sensor of claim 1, wherein the target includes a gear having an axis of rotation and a width parallel to the axis of rotation, and the second signal indicates whether the magnetic field sensor is offset, from a central axis of the gear, along a width of the gear.

5. The magnetic field sensor of claim 1, wherein any of the first bridge circuit and the second bridge circuit includes at least one of a Hall effect element, a giant magnetoresistance (GMR) element, a tunnel magnetoresistance (TMR) element, an anisotropic magnetoresistance (AMR) element, or a magnetic tunnel junction (MTJ) element.

6. The magnetic field sensor of claim 1, wherein:
   the substrate has a first axis that intersects a second axis,
   the first bridge circuit includes: (i) a first magnetic field sensing element that is coupled in series with a second magnetic field sensing element, and (ii) a third magnetic field sensing element that is coupled in series with a fourth magnetic field sensing element;
   the second bridge circuit includes: (i) a fifth magnetic field sensing element that is coupled in series with a sixth magnetic field sensing element, and (ii) a seventh magnetic field sensing element that is coupled in series with an eighth magnetic field sensing element,
   the first magnetic field sensing element and the second magnetic field sensing element are formed on opposite sides of the first axis and on the same side of the second axis, the third magnetic field sensing element and the fourth magnetic field sensing element are formed on opposite sides of the first axis and on the same side of the second axis,
   the fifth magnetic field sensing element and the sixth magnetic field sensing element are formed on opposite sides of the first axis and the second axis, and
   the seventh magnetic field sensing element and the eighth magnetic field sensing element are formed on opposite sides of the first axis and the second axis.

7. The magnetic field sensor of claim 1, wherein:

the substrate includes a first axis defining a first region and a second region of the substrate, wherein the first bridge circuit includes: (i) a first plurality of magnetic field sensing elements that are coupled in series, the first plurality of magnetic field sensing elements including a first magnetic field sensing element and a second magnetic field sensing element, the first magnetic field sensing element being formed in the first region of the substrate, and the second magnetic field sensing element being formed in the second region of the substrate, and (ii) a second plurality of magnetic field sensing elements that are coupled in series, the second plurality of magnetic field sensing elements including a third magnetic field sensing element and a fourth magnetic field sensing element, the third magnetic field sensing element being formed in the second region of the substrate, and the fourth magnetic field sensing element being formed in the first region of the substrate;

the second bridge circuit includes: (i) a third plurality of magnetic field sensing elements that are coupled in series, the third plurality of magnetic field sensing elements including a fifth magnetic field sensing element formed in the first region of the substrate and a sixth magnetic field sensing element formed in the second region of the substrate; and (ii) a fourth plurality of magnetic field sensing elements that are coupled in series, the fourth plurality of magnetic field sensing elements including a seventh magnetic field sensing element formed in the first region of the substrate and an eighth magnetic field sensing element formed in the second region of the substrate.

8. The magnetic field sensor of claim 7, further comprising:

a first terminal for connecting the magnetic field sensor to a voltage source; and a second terminal for connecting the magnetic field sensor to ground, wherein, the second magnetic field sensing element is coupled to the first terminal via the first magnetic field sensing element, and the first magnetic field sensing element is coupled to the second terminal via the second magnetic field sensing element, wherein, the fourth magnetic field sensing element is coupled to the first terminal via the third magnetic field sensing element, and the third magnetic field sensing element is coupled to the second terminal via the fourth magnetic field sensing element, wherein, the sixth magnetic field sensing element is coupled to the first terminal via the fifth magnetic field sensing element, and the fifth magnetic field sensing element is coupled to the second terminal via the sixth magnetic field sensing element, and wherein, the seventh magnetic field sensing element is coupled to the second terminal via the eighth magnetic field sensing element, and the eighth magnetic field sensing element is coupled to the first terminal via the seventh magnetic field sensing element.

9. A magnetic field sensor comprising:

a substrate having a first axis defining a first region and a second region, the first region and the second region being on opposite sides of the first axis;

a first plurality of magnetic field sensing elements formed on the substrate, the first plurality of magnetic field sensing elements including a first magnetic field sensing element that is coupled in series with a second magnetic field sensing element, the first magnetic field sensing element being formed in the first region of the substrate and the second magnetic field sensing element being formed in the second region of the substrate; and a second plurality of magnetic field sensing elements formed on the substrate, the second plurality of magnetic field sensing elements including a third magnetic field sensing element that is coupled in series with fourth magnetic field sensing element, the third magnetic field sensing element formed in the first region of the substrate and a fourth magnetic field sensing element formed in the first region of the substrate, wherein the second plurality of magnetic field sensing elements is arranged to generate a second signal indicative of whether the magnetic field sensor is aligned with a central axis of a target, the central axis extending along a circumference of the target, and the second bridge circuit being configured such that: (i) the second signal is set to a first level when the magnetic field sensor is aligned with the central axis and (ii) and the second signal is set to a second DC level when the magnetic field sensor is offset from the central axis.

10. The magnetic field sensor of claim 9, wherein:

the substrate has a second axis that is orthogonal to the first axis;

the first magnetic field sensing element and the second magnetic field sensing element are formed on a same side of the second axis;

the third magnetic field sensing element and the fourth magnetic field sensing element are formed on opposite sides of the second axis.

11. The magnetic field sensor of claim 9, wherein the first plurality of magnetic field sensing elements are arranged to form a half-bridge circuit, the second plurality of magnetic field sensing elements are arranged to form a half-bridge circuit, and the second signal is further indicative of a presence of a stray magnetic field.

12. The magnetic field sensor of claim 9, wherein any of the first magnetic field sensing element, the second magnetic field sensing element, the third magnetic field sensing element, and the fourth magnetic field sensing element includes at least one of a Hall effect element, a giant magnetoresistance (GMR) element, a tunnel magnetoresistance (TMR) element, an anisotropic magnetoresistance (AMR) element, or a magnetic tunnel junction (MTJ) element.

13. The magnetic field sensor of claim 9, further comprising:

a first terminal for connecting the magnetic field sensor to a voltage source; and a second terminal for connecting the magnetic field sensor to ground, wherein, the second magnetic field sensing element [B] is coupled to the first terminal [vcc] via the first magnetic field sensing element [A], and the first magnetic field sensing element [A] is coupled to the second terminal [gnd] via the second magnetic field sensing element [B], wherein, the fourth magnetic field sensing element [G] is coupled to the first terminal [VCC] via the third magnetic field sensing element [E], and the third magnetic field sensing element [E] is coupled to the second terminal [gnd] via the fourth magnetic field sensing element [E].

14. The magnetic field sensor of claim 9, wherein:

the first plurality of magnetic field sensing elements is configured to generate a first signal indicating a speed of rotation of the target, and the second plurality of magnetic field sensing elements is configured to generate a second signal indicating whether the magnetic field sensor is aligned with the target.

15. The magnetic field sensor of claim 14, wherein the target includes a gear having an axis of rotation and a width parallel to the axis of rotation, the second signal indicates whether the magnetic field sensor is offset along the width of the gear.

16. A magnetic field sensor comprising:
a substrate having a first axis and a second axis that intersects the first axis;
a first plurality of magnetic field sensing elements formed on the substrate, the first plurality of magnetic field sensing elements including a first magnetic field sensing element that is coupled in series with a second magnetic field sensing element, the first magnetic field sensing element and the second magnetic field sensing element being formed on opposite sides of the first axis and the second axis;
a second plurality of magnetic field sensing elements formed on the substrate, the second plurality of magnetic field sensing elements including a third magnetic field sensing element that is coupled in series with a fourth magnetic field sensing element, the third magnetic field sensing element and the fourth magnetic field sensing element being formed on opposite sides of the first axis and the second axis, the second plurality of magnetic field sensing elements being electrically coupled to the first plurality of magnetic field sensing elements to form a first bridge circuit,
wherein the second plurality of magnetic field sensing elements is arranged to generate a second signal indicative of whether the magnetic field sensor is aligned with a central axis of a target, the central axis extending along a circumference of the target, and the second bridge circuit being configured such that: (i) the second signal is set to a first level when the magnetic field sensor is aligned with the central axis and (ii) and the second signal is set to a second DC level when the magnetic field sensor is offset from the central axis.

17. The magnetic field sensor of claim 16, further comprising a processing circuitry configured to:
receive a first internal signal that is generated using the first bridge circuit; and
generate a first output signal based on the first internal signal, the first output signal indicating whether the magnetic field sensor is aligned with the target.

18. The magnetic field sensor of claim 17, wherein the target includes a gear, and the second signal indicates whether the magnetic field sensor is offset along a width of the gear.

19. The magnetic field sensor of claim 16, wherein any of the first magnetic field sensing element, the second magnetic field sensing element, the third magnetic field sensing element, and the fourth magnetic field sensing element includes one of a giant magnetoresistance (GMR) element or a tunnel magnetoresistance (TMR) element.

20. The magnetic field sensor of claim 16, further comprising:
a third plurality of magnetic field sensing elements formed on the substrate, the third plurality of magnetic field sensing elements including a fifth magnetic field sensing element that is coupled in series with a sixth magnetic field sensing element, the fifth magnetic field sensing element and the sixth magnetic field sensing element being formed on the same side of the second axis and opposite sides of the first axis; and
a fourth plurality of magnetic field sensing elements formed on the substrate, the fourth plurality of magnetic field sensing elements being electrically coupled to the third plurality of magnetic field sensing elements to form a second bridge circuit, the fourth plurality of magnetic field sensing elements including a seventh magnetic field sensing element that is coupled in series with an eighth magnetic field sensing element, the seventh magnetic field sensing element and the eighth magnetic field sensing element being formed on a same side of the second axis and on opposite sides of the first axis.

21. The magnetic field sensor of claim 20, further comprising a processing circuitry configured to:
receive first internal signal that is generated using the first bridge circuit;
receive a second internal signal that is generated using the second bridge circuit;
generate a first output signal based on the first internal signal, the first output signal indicating an offset of the magnetic field sensor relative to the target; and
generate a second output signal based on the second internal signal, the second output signal indicating a speed of rotation of the target.

22. The magnetic field sensor of claim 16, further comprising a processing circuitry configured to:
receive a first internal signal that is generated using the first bridge circuit; and
generate a first output signal based on the first internal signal, the first output signal indicating whether a stray magnetic field is incident on the magnetic field sensor.

23. A magnetic field sensor, comprising:
a substrate;
a first bridge circuit formed on the substrate, the first bridge circuit being arranged to generate a first signal indicative of a motion of a target; and
a means for generating a second signal indicative of whether the magnetic field sensor is aligned with a central axis of the target, the central axis along a circumference of the target, wherein: (i) the second signal is set to a first level when the magnetic field sensor is aligned with th central axis and (ii) and the second signal is set to a second DC level when the magnetic field sensor is offset from the central axis.

24. A magnetic field sensor comprising:
a substrate having a first axis defining a first region and a second region, the first region and the second region being on opposite sides of the first axis;
a first plurality of magnetic field sensing elements formed on the substrate, the first plurality of magnetic field sensing elements including a first magnetic field sensing element that is coupled in series with a second magnetic field sensing element, the first magnetic field sensing element being formed in the first region of the substrate and the second magnetic field sensing element being formed in the second region of the substrate;
a second plurality of magnetic field sensing elements formed on the substrate, the second plurality of magnetic field sensing elements including a third magnetic field sensing element that is coupled in series with fourth magnetic field sensing element, the third magnetic field sensing element formed in the first region of the substrate and a fourth magnetic field sensing element formed in the first region of the substrate;
a third plurality of magnetic field sensing elements formed on the substrate, the third plurality of magnetic field sensing elements including a fifth magnetic field sensing element that is coupled in series with a sixth magnetic field sensing element, the fifth magnetic field sensing element and the sixth magnetic field sensing element being formed on the same side of the second axis and opposite sides of the first axis; and
a fourth plurality of magnetic field sensing elements formed on the substrate, the fourth plurality of magnetic field sensing elements being electrically coupled to the third plurality of magnetic field sensing elements to form a second bridge circuit, the fourth plurality of magnetic field sensing elements including a seventh magnetic field sensing element that is coupled in series with an eighth magnetic field sensing element, the seventh magnetic field sensing element and the eighth magnetic field sensing element being formed on a same side of the second axis and on opposite sides of the first axis.

25. The magnetic field sensor of claim 24, further comprising a processing circuitry configured to:
receive first internal signal that is generated using the first bridge circuit;
receive a second internal signal that is generated using the second bridge circuit;
generate a first output signal based on the first internal signal, the first output signal indicating an offset of the magnetic field sensor relative to a target; and
generate a second output signal based on the second internal signal, the second output signal indicating a speed of rotation of the target.

26. A magnetic field sensor comprising:
a substrate having a first axis defining a first region and a second region, the first region and the second region being on opposite sides of the first axis;
a first plurality of magnetic field sensing elements formed on the substrate, the first plurality of magnetic field sensing elements including a first magnetic field sensing element that is coupled in series with a second magnetic field sensing element, the first magnetic field sensing element being formed in the first region of the substrate and the second magnetic field sensing element being formed in the second region of the substrate; and
a second plurality of magnetic field sensing elements formed on the substrate, the second plurality of magnetic field sensing elements including a third magnetic field sensing element that is coupled in series with fourth magnetic field sensing element, the third magnetic field sensing element formed in the first region of the substrate and a fourth magnetic field sensing element formed in the first region of the substrate
a first terminal for connecting the magnetic field sensor to a voltage source; and
a second terminal for connecting the magnetic field sensor to ground,
wherein, the second magnetic field sensing element is coupled to the first terminal via the first magnetic field sensing element, and the first magnetic field sensing element is coupled to the second terminal via the second magnetic field sensing element,
wherein, the fourth magnetic field sensing element is coupled to the first terminal via the third magnetic field sensing element, and the third magnetic field sensing element is coupled to the second terminal via the fourth magnetic field sensing element.

27. A magnetic field sensor, comprising:
a substrate;
a first terminal for connecting the magnetic field sensor to a voltage source;
a second terminal for connecting the magnetic field sensor to ground,
a first bridge circuit formed on the substrate, the first bridge circuit being arranged to generate a first signal indicative of a motion of a target; and
a second bridge circuit formed on the substrate, the second bridge circuit being arranged to generate a second signal indicative of whether the magnetic field sensor is aligned with the target,
wherein the substrate includes a first axis defining a first region and a second region of the substrate, such that: the first bridge circuit includes: (i) a first plurality of magnetic field sensing elements that are coupled in series, the first plurality of magnetic field sensing elements including a first magnetic field sensing element and a second magnetic field sensing element, the first magnetic field sensing element being formed in the first region of the substrate, and the second magnetic field sensing element being formed in the second region of the substrate, and (ii) a second plurality of magnetic field sensing elements that are coupled in series, the second plurality of magnetic field sensing elements including a third magnetic field sensing element and a fourth magnetic field sensing element, the third magnetic field sensing element being formed in the second region of the substrate, and the fourth magnetic field sensing element being formed in the first region of the substrate; and the second bridge circuit includes: (i) a third plurality of magnetic field sensing elements that are coupled in series, the third plurality of magnetic field sensing elements including a fifth magnetic field sensing element formed in the first region of the substrate and a sixth magnetic field sensing element formed in the second region of the substrate; and (ii) a fourth plurality of magnetic field sensing elements that are coupled in series, the fourth plurality of magnetic field sensing elements including a seventh magnetic field sensing element formed in the first region of the substrate and an eighth magnetic field sensing element formed in the second region of the substrate,
wherein, the second magnetic field sensing element is coupled to the first terminal via the first magnetic field sensing element, and the first magnetic field sensing element is coupled to the second terminal via the second magnetic field sensing element,
wherein, the fourth magnetic field sensing element is coupled to the first terminal via the third magnetic field sensing element, and the third magnetic field sensing element is coupled to the second terminal via the fourth magnetic field sensing element,
wherein, the sixth magnetic field sensing element is coupled to the first terminal via the fifth magnetic field sensing element, and the fifth magnetic field sensing element is coupled to the second terminal via the sixth magnetic field sensing element, and
wherein, the seventh magnetic field sensing element is coupled to the second terminal via the eighth magnetic field sensing element, and the eighth magnetic field sensing element is coupled to the first terminal via the seventh magnetic field sensing element.

\* \* \* \* \*

UNITED STATES PATENT AND TRADEMARK OFFICE
CERTIFICATE OF CORRECTION

PATENT NO. : 11,169,221 B2  
APPLICATION NO. : 16/801493  
DATED : November 9, 2021  
INVENTOR(S) : Jeffrey Eagen Page 1 of 1

It is certified that error appears in the above-identified patent and that said Letters Patent is hereby corrected as shown below:

In the Specification

Column 1, Lines 52-53 delete "with fourth" and replace with --with a fourth--.

Column 3, Line 47 delete "VDIFF1" and replace with --VD1FF$_1$,--.

Column 4, Line 44 delete "DS1" and replace with --DS$_1$,--.

Column 5, Line 58 delete "substrate," and replace with --substrate 120.--.

Column 7, Line 12 delete "of the of the" and replace with --of the--.

Column 10, Line 1 delete "sending" and replace with --sensing--.

Column 10, Line 6 delete "(final)".

In the Claims

Column 12, Line 53 delete "[vcc]" and replace with --[VCC]--.

Column 14, Lines 64-65 delete "with fourth" and replace with --with a fourth--.

Column 15, Lines 51-52 delete "with fourth" and replace with --with a fourth--.

Column 15, Line 1 delete "and a fourth" and replace with --and the fourth--.

Signed and Sealed this  
Twenty-fifth Day of July, 2023

Katherine Kelly Vidal  
*Director of the United States Patent and Trademark Office*